United States Patent [19]

Kauffman et al.

[11] Patent Number: 5,736,444
[45] Date of Patent: *Apr. 7, 1998

[54] METHODS OF FORMING NON-VOLATILE MEMORY ARRAYS

[75] Inventors: Ralph Kauffman; Roger Lee, both of Boise, Id.

[73] Assignee: Micron Technology, Inc., Boise, Id.

[*] Notice: The term of this patent shall not extend beyond the expiration date of Pat. No. 5,661,054.

[21] Appl. No.: 821,244

[22] Filed: Mar. 20, 1997

Related U.S. Application Data

[63] Continuation of Ser. No. 444,859, May 19, 1995, Pat. No. 5,661,054.

[51] Int. Cl.[6] .................................................. H01L 21/8247
[52] U.S. Cl. ............................................ 438/257; 438/261
[58] Field of Search ..................................... 438/257–267

[56] References Cited

U.S. PATENT DOCUMENTS

| | | | |
|---|---|---|---|
| 5,229,326 | 7/1993 | Dennison | 437/195 |
| 5,270,240 | 12/1993 | Lee | 437/52 |
| 5,427,966 | 6/1995 | Komori | 437/43 |
| 5,484,741 | 1/1996 | Bergemont | 437/43 |

*Primary Examiner*—Jey Tsai
*Attorney, Agent, or Firm*—Wells, St. John Roberts, Gregory & Matkin, P.S.

[57] ABSTRACT

Methods of forming non-volatile memory arrays are described. In one implementation, at least two adjacent laterally spaced apart word lines having floating gates are formed over a semiconductor material substrate. The word lines have respective lateral width dimensions. An insulating material is formed over the word lines and effectively completely covers individual word line tops. Masking material is formed over the insulating material to overlie less than all of each word line's lateral width dimension. The insulating material is etched to a degree sufficient to leave discrete insulating blocks over only a portion of the respective word lines' lateral width dimensions which include the laterally closest portions of the two word lines.

14 Claims, 5 Drawing Sheets

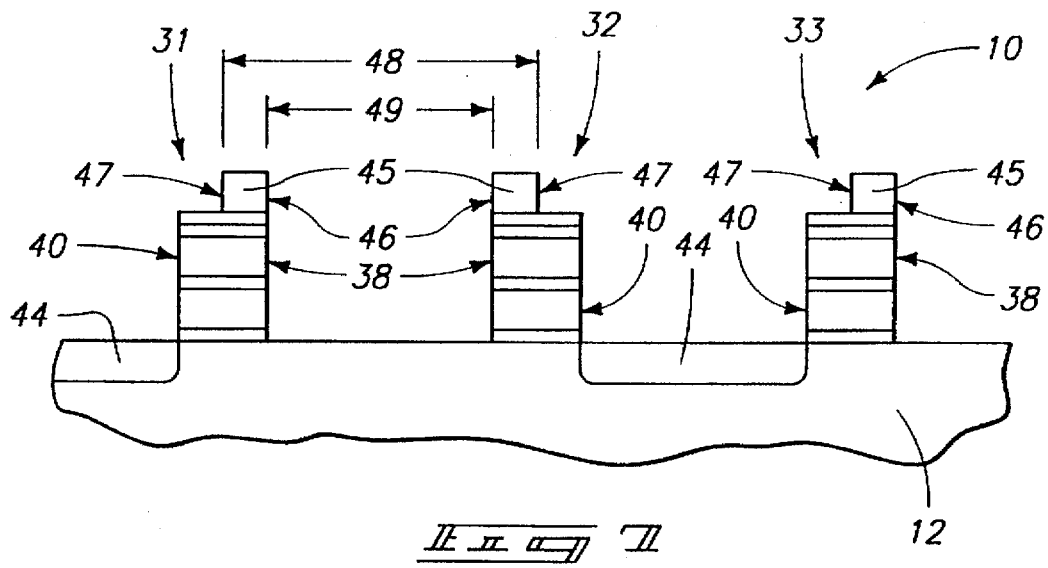
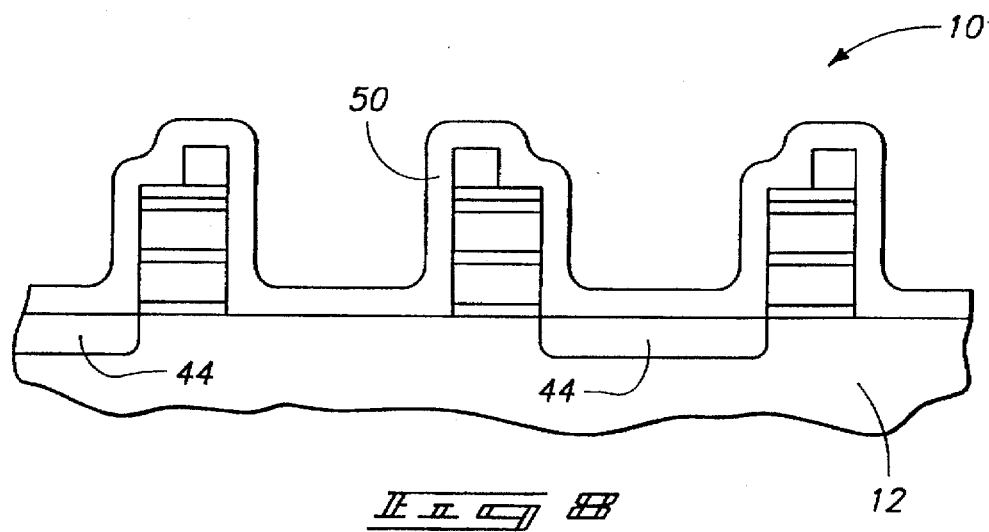
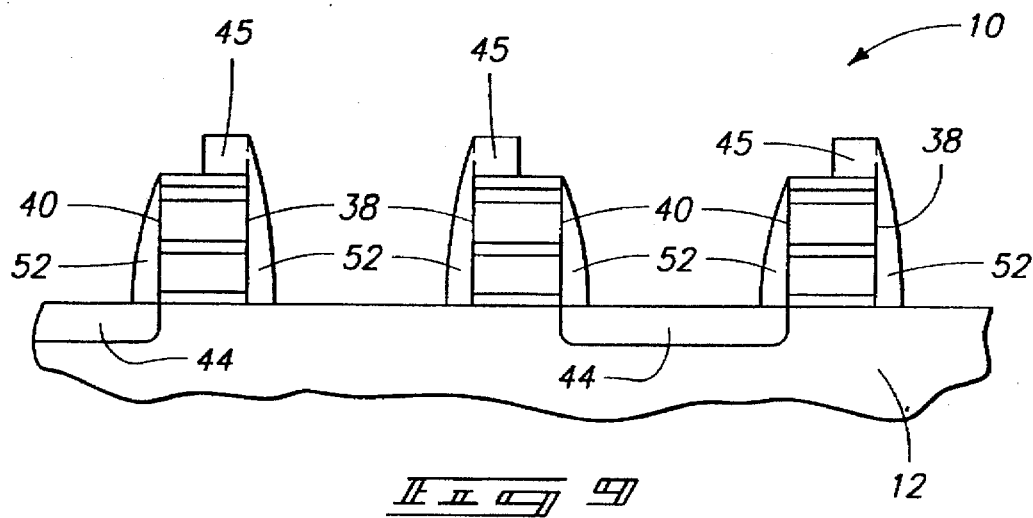

METHODS OF FORMING NON-VOLATILE MEMORY ARRAYS

RELATED PATENT DATA

This patent resulted from a continuation application of U.S. patent application Ser. No. 08/444,859, filed on May 19, 1995, U.S. Pat. No. 5,661,054, entitled "Programmable Non-Volatile Memory Cell and Method of Forming a Non-Volatile Memory Cell" listing the inventors as Ralph E. Kauffman and Roger R. Lee.

TECHNICAL FIELD

This invention relates generally to fabrication of semiconductor wafers to form memory arrays non-volatile memory devices employing floating gate transistors.

BACKGROUND OF THE INVENTION

Typical semiconductor memory utilized during microprocessor operation is volatile. That is in the case of power interruption, the data stored in the semiconductor memory is typically completely lost. One way to circumvent this problem is to provide separate backup of the memory, such as battery power or capacitor storage. An alternate technique is to make the memory fundamentally non-volatile. This option is highly desirable because non-volatile semiconductor memories would not only withstand power interruption, but also would be stored or shipped without being energized.

Random access memories (RAMs) enable information to be both stored and read to a memory cell as dictated by a microprocessor. Read-only-memories (ROMs), on the other hand, are memories into which information is permanently stored during fabrication and cannot be subsequently written to by a microprocessor. All ROM memory is considered non-volatile as only read operations can be performed.

Each bit of information in a ROM is stored by the presence or absence of a data path from the word (access) line to a bit (sense) line. The data path is eliminated simply by insuring no circuit element joins a word and bit line. Thus, when the word line of a ROM is activated, the presence of a signal on the bit line will mean that a 1 is stored, whereas the absence of a signal indicates that a 0 is stored.

If only a small number of ROM circuits are needed for a specific application, custom mask fabrication might be too expensive or time consuming. In such cases, it would be faster and cheaper for users to program each ROM chip individually. ROMs with such capabilities are referred to as programmable read-only-memories (PROMs). In the first PROMs which were developed, information could only be programmed once into the construction and then could not be erased. In such PROMs, a data path exists between every word and bit line at the completion of the chip manufacture. This corresponds to a stored 1 in every data position. Storage cells during fabrication were selectively altered to store a 0 following manufacture by electrically severing the word-to-bit connection paths. Since the write operation was destructive, once the 0 had been programmed into a bit location it could not be erased back to a 1. PROMs were initially implemented in bipolar technology, although MOS PROMs became available.

Later work with PROMs led to development of erasable PROMs. Erasable PROMs depend on the long-term retention of electric charge as the means for information storage. Such charge is stored on a MOS device referred to as a floating polysilicon gate. Such a construction differs slightly from a conventional MOS transistor gate. The conventional MOS transistor gate of a memory cell employs a continuous polysilicon word line connected among several MOS transistors which functions as the respective transistor gates. The floating polysilicon gate of an erasable PROM interposes a localized secondary polysilicon gate in between the continuous word line and silicon substrate into which the active areas of the MOS transistors are formed. The floating gate is localized in that the floating gates for respective MOS transistors are electrically isolated from the floating gates of other MOS transistors.

Various mechanisms have been implemented to transfer and remove charge from a floating gate. One type of erasable programmable memory is the so-called electrically programmable ROM (EPROM). The charge-transfer mechanism occurs by the injection of electrons into the floating polysilicon gate of selected transistors. If a sufficiently high reverse-bias voltage is applied to the transistor drain being programmed, the drain-substrate "pn" junction will experience "avalanche" breakdown, causing hot electrons to be generated. Some of these will have enough energy to pass over the insulating oxide material surrounding each floating gate and thereby charge the floating gate. These EPROM devices are thus called floating-gate, avalanche-injection MOS transistors (FAMOS). Once these electrons are transferred to the floating gate, they are trapped there. The potential-barrier at the oxide-silicon interface of the gate is greater than 3 eV, making the rate of spontaneous emission of the electrons from the oxide over the barrier negligibly small. Accordingly, the electronic charge stored on the floating gate can be retained for many years.

When the floating gate is charged with a sufficient number of electrons, inversion of the channel under the gate occurs. A continuously conducting channel is thereby formed between the source and drain exactly as if an external gate voltage had been applied. The presence of a 1 or 0 in each bit location is therefore determined by the presence or absence of a conducting floating channel gate in each device.

Such a construction also enables means for removing the stored electrons from the floating gate, thereby making the PROM erasable. This is accomplished by flood exposure of the EPROM with strong ultraviolet light for approximately 20 minutes. The ultraviolet light creates electron-hole pairs in the silicon dioxide, providing a discharge path for the charge (electrons) from the floating gates.

In some applications, it is desirable to erase the contents of a ROM electrically, rather than to use an ultraviolet light source. In other circumstances, it would be desirable to be able to change one bit at a time, without having to erase the entire integrated circuit. Such led to the development of electrically erasable PROMs (EEPROMs). Such technologies include MNOS transistors, floating-gate tunnel oxide MOS transistors (FLOTOX), textured high-polysilicon floating-gate MOS transistors, and flash EEPROMs. Such technologies can include a combination of floating gate transistor memory cells within an array of such cells, and a peripheral area to the array which comprises CMOS transistors.

With floating gate transistors, the floating gate polysilicon (commonly referred to as Poly 1) is positioned in between the overlying word line polysilicon (commonly referred to as Poly 2) and underlying substrate. Two edges of the floating gate poly are lined up directly relative to the word line edge. This factor would make the photo and etch process very difficult if one were to try to completely define the floating gate poly first, and then pattern the word line. This would be due to the problems of photomask misalignment and photo-edge etch effect.

One approach of avoiding this problem is to first define only two edges (instead of all four edges) of the floating gate. The typical two edges patterned first are the Poly 1 floating gate edges which do not coincide with the word line edges. With this completed, a stack poly etch for the word lines during the Poly 2 etch (word line) patterning defines the word line edges as well as the remaining two edges of the floating gate. This approach is not sensitive to any misalignment in the second etch due to the fact that the word line and corresponding floating gate edges "self-align" relative to each other during the same etching process.

BRIEF DESCRIPTION OF THE DRAWINGS

Preferred embodiments of the invention are described below with reference to the following accompanying drawings.

FIG. 7 is a cross-sectional view of the FIG. 1 wafer taken at a processing step subsequent to that shown by FIG. 6.

FIG. 8 is a cross-sectional view of the FIG. 1 wafer taken at a processing step subsequent to that shown by FIG. 7.

FIG. 9 is a cross-sectional view of the FIG. 1 wafer taken at a processing step subsequent to that shown by FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a non-volatile memory array comprises the following steps:

providing first and second floating gate word lines atop a semiconductor substrate, the first and second word lines being adjacent one another and defining transistor active area therebetween, the first and second word lines having inwardly opposing and facing active area sidewall edges, the first and second word lines each comprising respective nitride capping layers having a thickness of at least about 1000 Angstroms;

providing a nitride spacer layer over the nitride capping layer;

anisotropically etching the nitride spacer layer to produce insulating sidewall spacers over the first and second word line active area sidewall edges, the anisotropic etching leaving at least a portion of the nitride capping layer covering each of the first and second word lines, the portion of each nitride capping layer joining with one of the sidewall spacers to cover the first and second word line active area sidewall edges and thereby defining a widened mask misalignment area than were such capping layer portions not present;

providing an oxide layer over the sidewall spacers and capping layer;

patterning and etching the oxide layer selectively relative to the nitride capping layer and sidewall spacers to define a contact opening to the active area, the contact opening overlapping with at least one nitride capping layer portion on one of the word lines; and providing an electrically conductive plug within the contact opening.

In accordance with another aspect of the invention, a non-volatile memory array comprises.:

first and second floating gate word lines atop a semiconductor substrate, the first and second word lines being adjacent one another and defining a substrate transistor drain region therebetween, the first and second word lines having inwardly opposing and facing drain sidewall edges, the first and second word lines having outwardly opposing source sidewall edges, a nitride block atop each of the first and second floating gates, the nitride blocks having a respective inner drain sidewall edge which aligns with the respective word line sidewall edge, the nitride blocks having a respective outer source sidewall edge positioned intermediate the respective word line drain sidewall edge and the respective word line source sidewall edge;

a sidewall spacer over each first and second word line drain sidewall edge, the inner drain sidewall edges of the nitride blocks joining with the sidewall spacers to cover the first and second word line drain sidewall edges; and a conductive plug extending upwardly from the substrate drain region.

Figure 1:
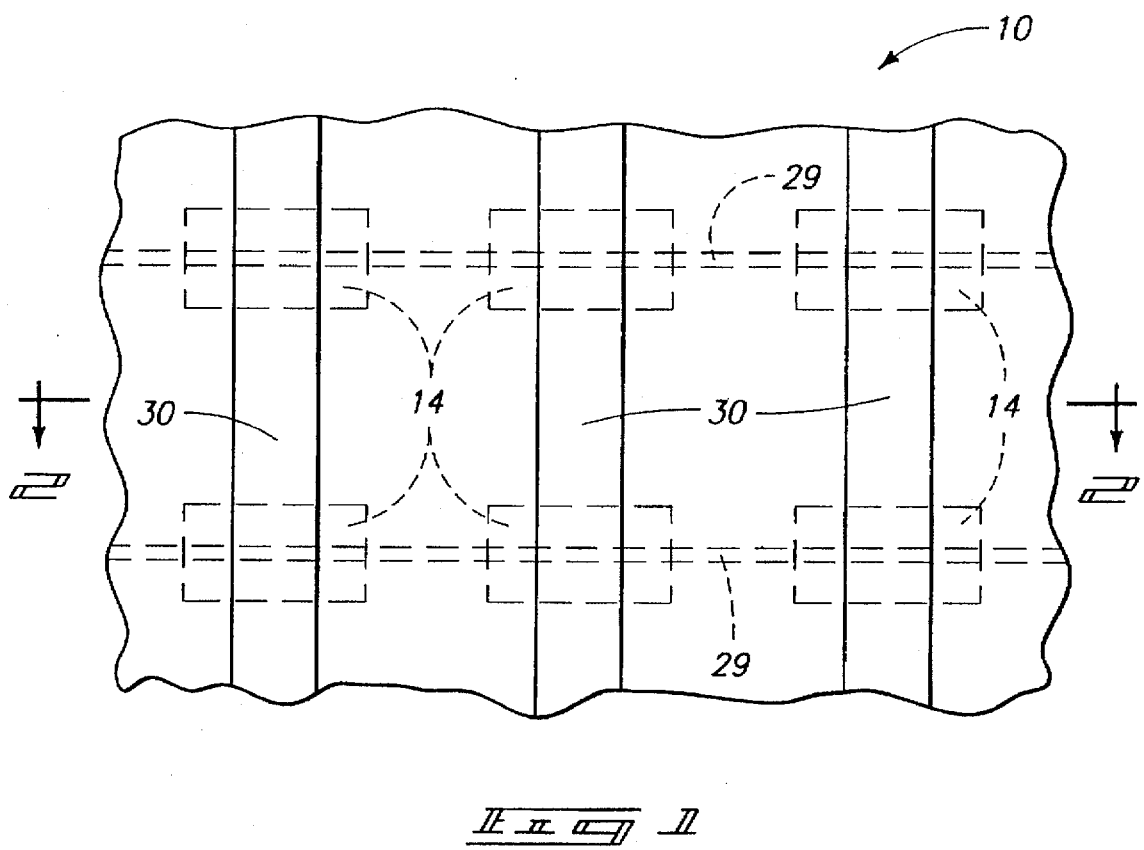
FIG. 1 is a top view of a semiconductor wafer fragment at one processing step in accordance with the invention.
Figure 2:
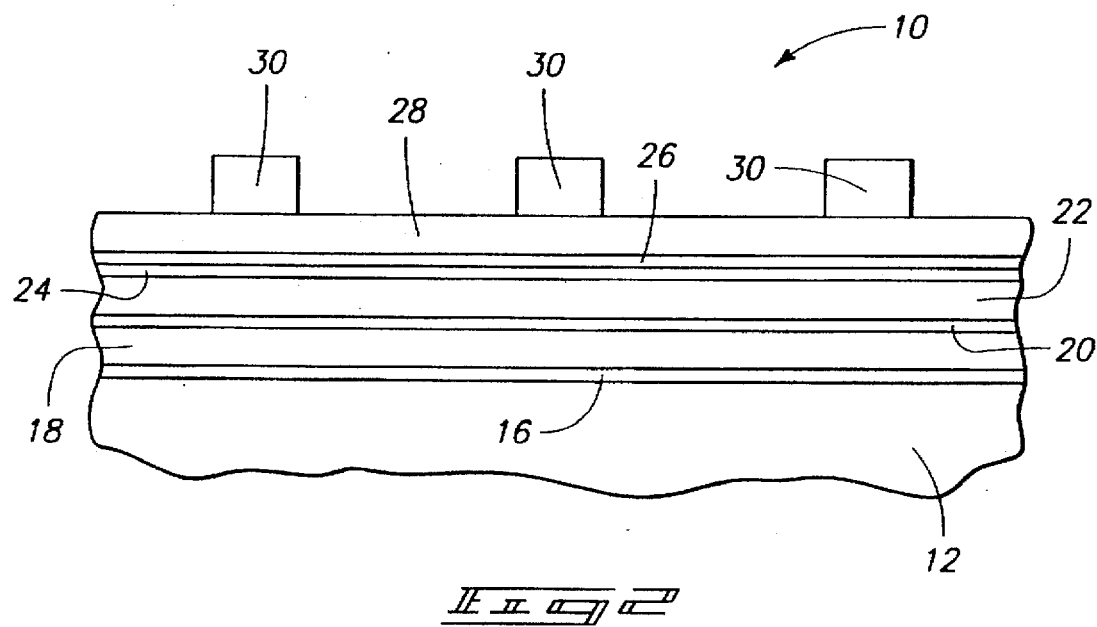
FIG. 2 is a cross-sectional view of the FIG. 1 wafer taken through line 2—2 in FIG. 1.

Referring first to FIGS. 1 and 2, a semiconductor substrate fragment in process is indicated generally with reference numeral 10. Such is comprised of a bulk substrate 12 having field oxide regions 14 formed thereatop. A series of layers is provided atop bulk substrate 12 for formation of floating gate word lines. Specifically, a gate oxide layer 16 is provided to a typical thickness of 100 Angstroms. A conductively doped polysilicon layer 18 is provided over gate oxide 16 to a typical thickness of 1000 Angstroms. An ONO dielectric layer 20 is provided atop a polysilicon layer 18 to a typical effective oxide thickness of 250 Angstroms. A second conductively doped polysilicon layer 22 is provided over dielectric layer 20 to a typical thickness of 2000 Angstroms. A tungsten layer 24 is provided over polysilicon layer 22 to a typical thickness of 1200 Angstroms. Subsequent high temperature processing of the wafer will cause a reaction of tungsten layer 24 with the polysilicon of layer 22, thus rendering layer 24 in the form of a tungsten silicide.

An oxide layer 26 is provided atop tungsten layer 24 to a typical thickness of 350 Angstroms. A nitride cupping layer 28, preferably $Si_3N_4$, is provided over oxide layer 26 to a typical thickness of at least about 1,000 Angstroms. More preferably, nitride capping layer 28 is provided to a thickness of from about 1,500 Angstroms to about 3,000 Angstroms, with about 2,000 Angstroms being most preferred.

It is here where methodical aspects of the invention have departed from prior art construction. Prior art constructions typically use an oxide layer 26 of 350 Angstroms and an overlying nitride layer 28, but only at a thickness of 150 Angstroms. The prior art purpose of the composite oxide/ nitride layers 26, 28 is to prevent lifting of the resultant silicide of layer 24 from second polysilicon layer 22. The composite layers 26, 28 of this invention also advantageously provide this function. The thicker nitride layer also provides another, inventive, function as will be appreciated from the continuing discussion.

First polysilicon layer 18 has previously been etched to define a series of trenches 29 (FIG. 1) in layer 18 which will result in floating gate isolation upon word line formation. A layer of photoresist has been deposited and patterned to produce word line masking runners 30.

Figure 3:
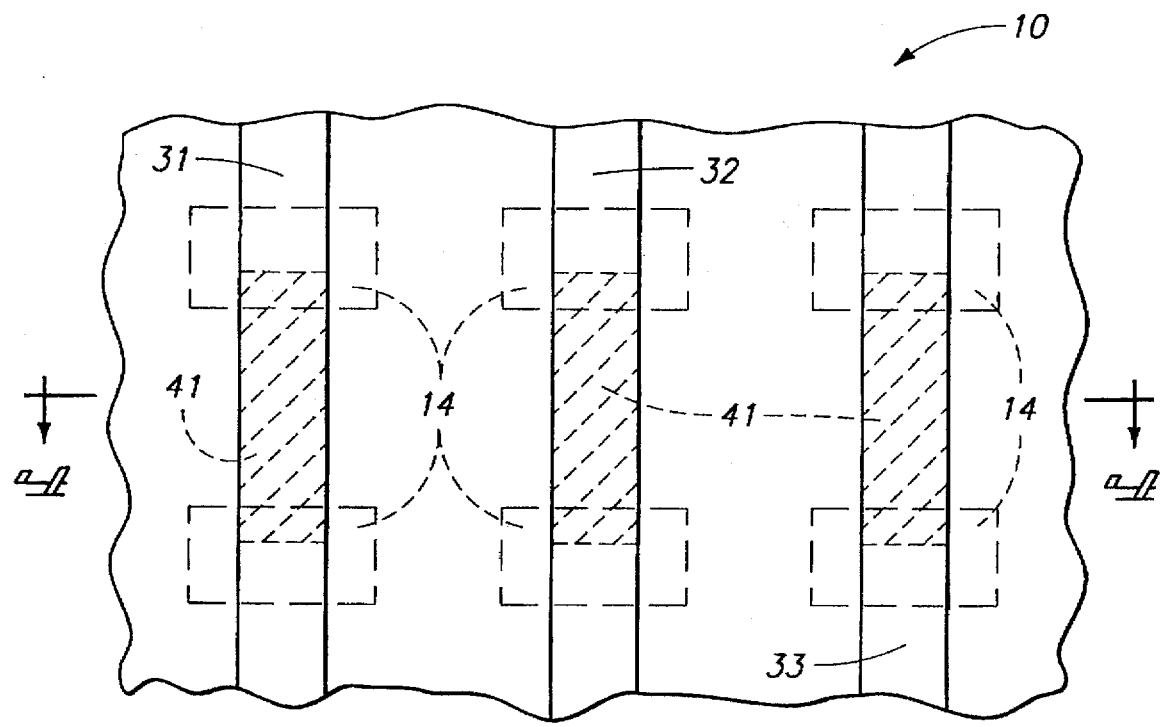
FIG. 3 is a top view of the FIG. 1 wafer taken at a processing step subsequent to that shown by FIG. 1.
Figure 4:
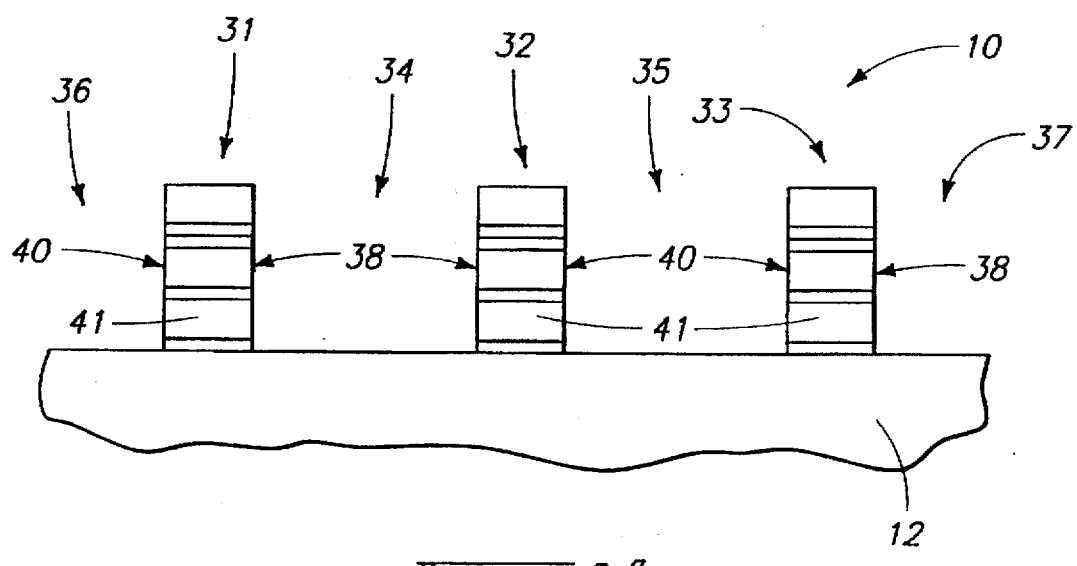
FIG. 4 is a cross-sectional view of FIG. 3 taken through line 4—4 in FIG. 3.

Referring to FIGS. 3 and 4, the illustrated layers have been etched and masking blocks 30 removed to define first, second and third floating gate word lines 31, 32 and 33, respectively, atop bulk substrate 12. First word line 31 is adjacent second word line 32 and defines a transistor drain area 34 therebetween. Second word line 32 and third word line 33 are adjacent one another and define a transistor source area 35 therebetween. Source and drain area would alternate relative to the word lines within the array, with source region 36 and drain region 37 being depicted outside of first word line 31 and third word line 33, respectively. The discussion proceeds principally with reference to first word line 31 and second word line 32. Such have inwardly opposing and facing respective drain sidewall edges 38, and outwardly opposing respective source sidewall edges 40. Source sidewall edges 40 of second word line 32 and third word line 33 are inwardly opposing and facing relative to one another. The illustrated word line etch has defined floating gates 41 for each word line. Only the central figure illustrated floating gates 41 are shown for clarity in the top views of FIGS. 3 and 5.

Figure 5:
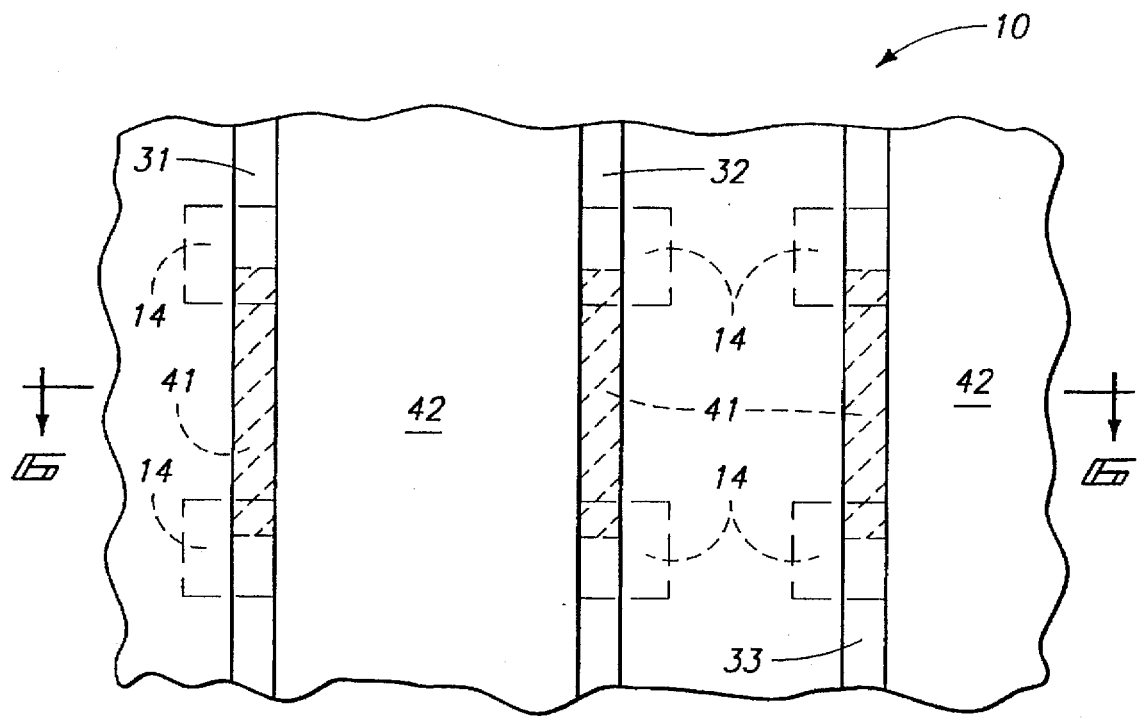
FIG. 5 is a top view of the FIG. 1 wafer taken at a processing step subsequent to that shown by FIG. 3.
Figure 6:
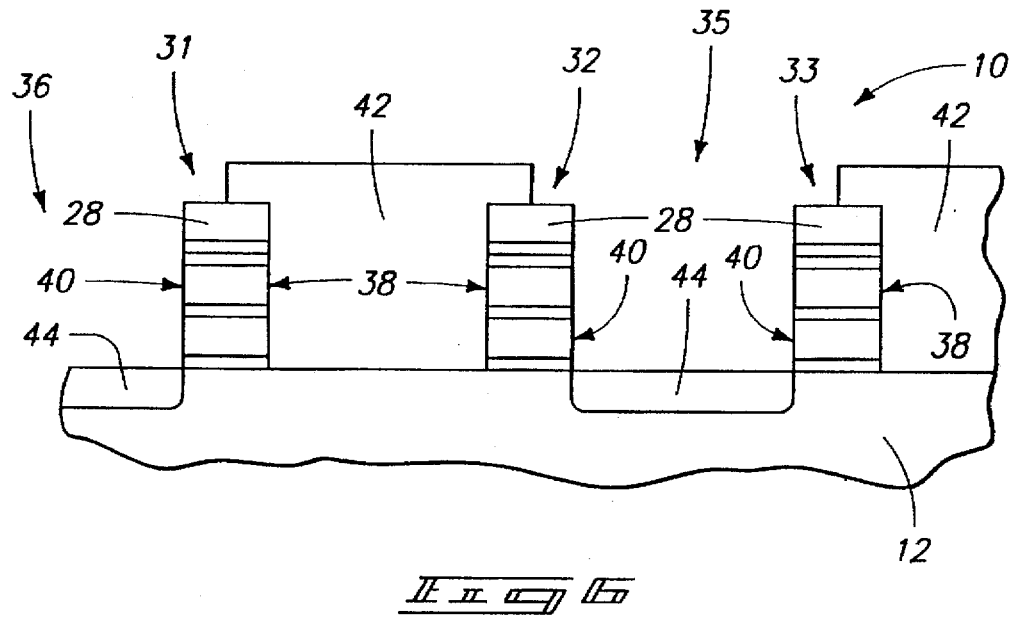
FIG. 6 is a cross-sectional view of the FIG. 5 wafer taken through line 6—6 in FIG. 5.

Referring to FIGS. 5 and 6, masking of nitride capping layers 28 is conducted. Specifically in the preferred embodiment, a layer of photoresist is deposited and patterned to define photoresist masking regions 42 which mask one-half of the width of capping layers 28 of each respective word line. Mask 42 covers over first and second word line drain sidewall edges 38, and leaves the source sidewall edges 40 exposed. Thus, mask openings are provided relative to source substrate areas 35 and 36. With mask 42 in place, n-type source doping of source areas 35 and 36 is conducted to produce substrate source implant regions 44. An example and preferred dose is $5 \times 10^{15}$ ions/cm$^2$ at 50 keV.

Referring to FIG. 7, exposed portions of masked nitride capping layers 28 are etched to define nitride blocks 45 which in the preferred embodiment partially cover each first, second and third floating gate word line 31, 32 and 33, respectively. The implant to produce source regions 44 could of course be conducted either prior to or after the etch utilized to produce blocks 45. Regardless and most preferably, the same mask utilized for producing source implants 44 is utilized for production of nitride blocks 45.

Nitride blocks 45 have respective inner drain sidewall edges 46 which align with respective word line drain sidewall edges 38. Nitride blocks 45 also have respective outer source sidewall edges 47 which are positioned intermediate the respective word line drain sidewall edges 38 and the respective word line source sidewall edges 40. As will be apparent from the continuing discussion, nitride blocks 45 define a widened mask misalignment area 48 between first word line 31 and second word line 32 in comparison to what would otherwise be available alignment area 49 were nitride blocks 45 not present.

Referring to FIG. 8, a nitride spacer layer 50, preferably LPCVD Si$_3$N$_4$, is provided over the substrate and nitride blocks. A preferred thickness for layer 50 is 1700 Angstroms.

Referring to FIG. 9, nitride layer 50 is anisotropically etched to produce insulating sidewall spacers 52 which cover over word line edges 38 and 40. Such etching may also etch a portion of the thickness of blocks 45 but will, due to the thickness of blocks 45, leave at least a portion of those blocks over each word line. Inner drain sidewall edges 46 of blocks 45 (FIG. 7) essentially homogeneously join with the adjoining sidewall spacers 52 to effectively cover the word line drain sidewall edges 38.

Figure 10:
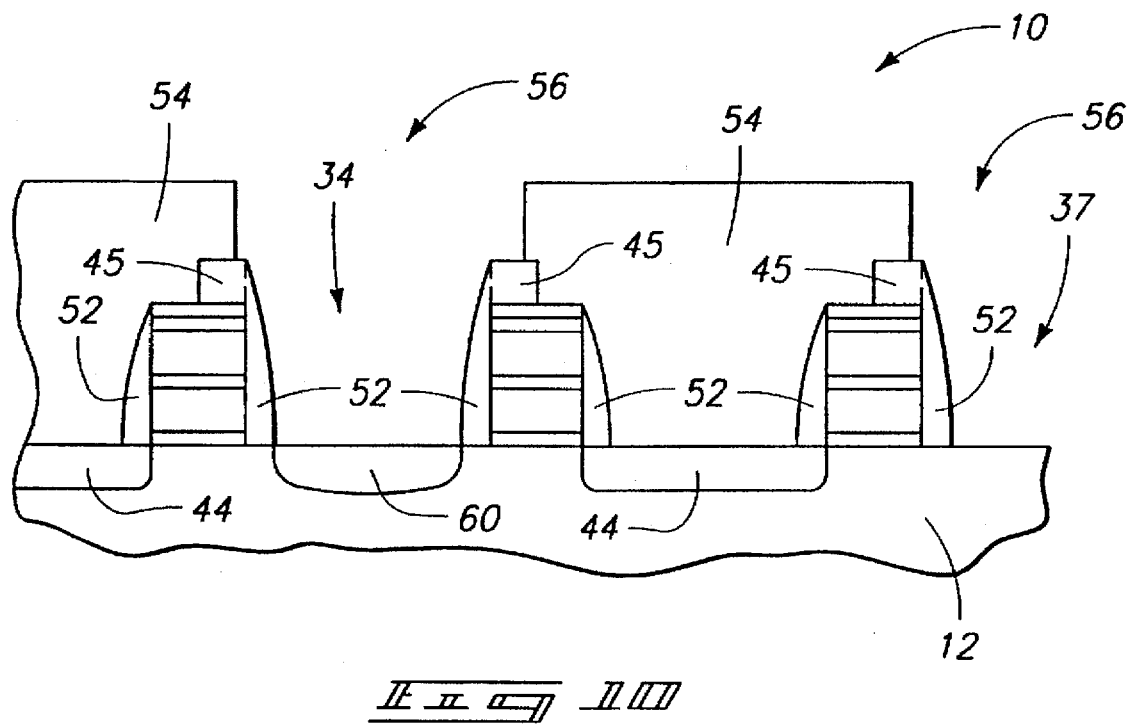
FIG. 10 is a cross-sectional view of the FIG. 1 wafer taken at a processing step subsequent to that shown by FIG. 9.

Referring to FIG. 10, an oxide layer 54 is deposited over sidewall spacers 52 and blocks 45, and is patterned and etched selectively relative thereto to define contact openings 56 to drain areas 34 and 37. Contact openings 56 overlap with at least one of nitride blocks 45 of each adjoining pair, with overlap of both nitride blocks of the adjoining pair being shown in the illustrated embodiment. As shown, blocks 45 provide for a degree of misalignment relative to the mass for producing contact openings 56, with a slight right misalignment being shown in FIG. 10 as an example.

The mask utilized to produce blocks 45 might be provided such that blocks 45 cover less than one-half or more than one-half of the illustrated word line widths, with exactly one-half being shown in the depicted embodiment. Caps 45 might also be provided to cover the entirety of the word line width, although such would not be preferred in the methodical aspects of the invention. The word line width inherently provides for some mask misalignment relative to the source implant. With oxide blocks 54 in place, n-type conductivity would be conducted to produce substrate drain areas 60.

Figure 11:
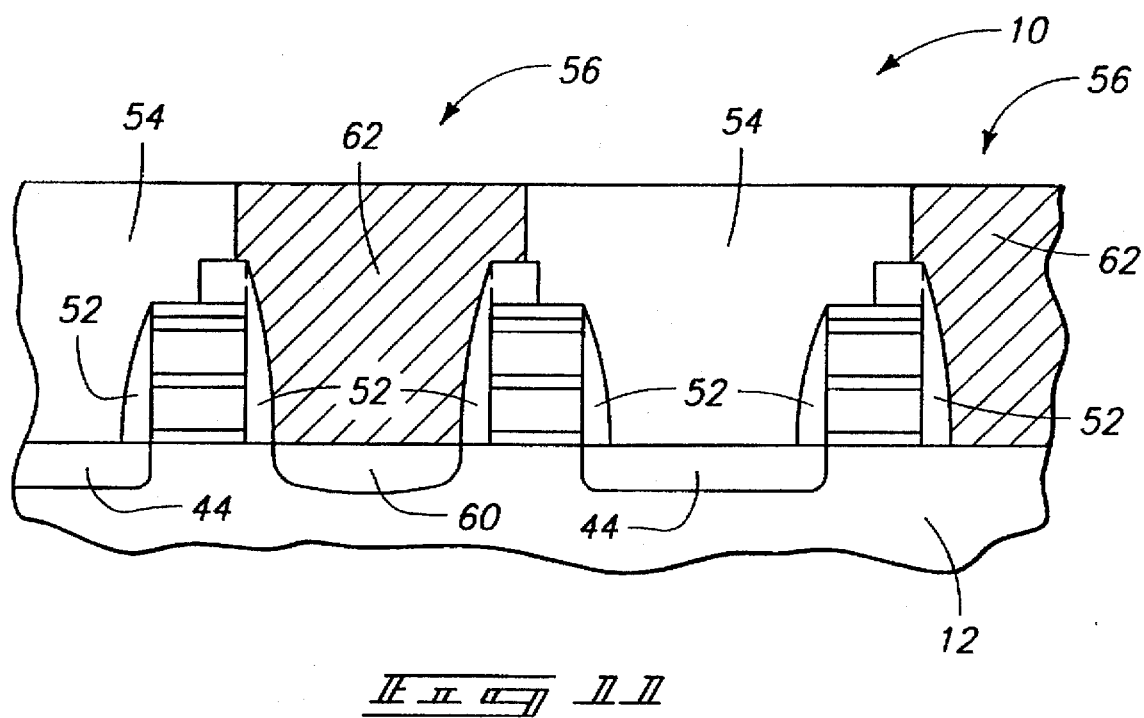
FIG. 11 is a cross-sectional view of the FIG. 1 wafer taken at a processing step subsequent to that shown by FIG. 10.

Referring to FIG. 11, electrically conductive plugs 62 are provided within contact openings 56 to provide an ohmic electrical connection to drain region 60. Such could comprise tungsten or conductively doped polysilicon. An example technique to produce the illustrated construction would be conductive material deposition, followed by chemical-mechanical polishing to produce the illustrated upper planarized structure. Subsequent conductive material deposition and patterning would be provided to produce desired interconnect lines for plugs 62.

The above process provides substantial self-alignment relative to the drain contacts because of the widened masked area provided by blocks 45. An improved, novel construction also results.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a non-volatile memory array comprising the following steps:

forming at least two adjacent laterally spaced apart word lines having floating gates over a semiconductor material substrate, the word lines having respective lateral width dimensions;

forming an insulating material over the word lines, the insulating material effectively completely covering individual word line tops;

forming masking material over the insulating material to overlie less than all of each word line's lateral width dimension; and etching the insulating material to a degree sufficient to leave discrete insulating blocks over only a portion of the respective word lines' lateral width dimensions which include the laterally closest portions of the two word lines.

2. The method of claim 1 further comprising with the masking material in place, implanting impurity into the substrate adjacent the word lines.

3. The method of claim 1 further comprising with the masking material in place and prior to the etching of the insulating material, implanting impurity into the substrate adjacent the word lines.

4. The method of claim 1 further comprising with the masking material in place and after the etching of the insulating material, implanting impurity into the substrate adjacent the word lines.

5. The method of claim 1 further comprising after the etching of the insulating material, forming a layer of spacer material over the word lines and anisotropically etching the spacer material to form respective sidewall spacers over the respective word lines.

6. The method of claim 1 further comprising:

after the etching of the insulating material, forming a layer of spacer material over the word lines;

anisotropically etching the spacer material to form respective sidewall spacers over the respective word lines, the sidewall spacers being elevationally taller over the laterally closest portions of the two word lines; and after anisotropically etching the spacer material, implanting impurity into the substrate between the word lines adjacent the elevationally taller sidewall spacers.

7. A method of forming a non-volatile memory array comprising, in a common masking step, a) patterning and etching an insulating material over a plurality of laterally spaced apart word lines having floating gates over a substrate to a degree sufficient to leave insulating blocks atop laterally closest portions of at least one adjacent pair of word lines, and less than all of said adjacent pair of word lines' lateral width dimensions, and b) after the patterning and etching, providing a conductivity modifying impurity into the substrate between word lines which do not have insulating blocks atop their laterally closest portions.

8. The method of claim 7 further comprising after the patterning and etching of the insulating material, forming a layer of spacer material over the word lines and etching the spacer material to form sidewall spacers over the word lines.

9. The method of claim 7 further comprising after the implanting of the impurity into the substrate, forming a layer of spacer material over the word lines and etching the spacer material to form sidewall spacers over the word lines.

10. The method of claim 7 further comprising after the implanting of the impurity into the substrate and in a separate step, implanting impurity into the substrate between said laterally closest portions of said individual word lines.

11. The method of claim 7 further comprising after the implanting step, forming conductive material between the word lines between which the impurity was not implanted, the conductive material being in electrical communication with the substrate.

12. A method of forming a non-volatile memory array comprising the following steps:

forming first, second and third word lines having floating gates atop a semiconductor substrate, the first and second word lines being adjacent one another and defining transistor drain area therebetween, the second and third word lines being adjacent one another and defining transistor source area therebetween, the first and second word lines having inwardly opposing and facing drain sidewall edges, the second and third word lines having inwardly opposing and facing source sidewall edges, the word lines comprising respective nitride capping layers having respective lateral width dimensions and a thickness of at least about 1000 Angstroms;

masking less than all of the nitride capping layers' lateral width dimensions over each of the first, second and third word lines, the mask covering over the first and second word line drain sidewall edges, the mask exposing the first and second word line source sidewall edges;

etching exposed portions of the masked nitride capping layers to define nitride blocks which partially cover each first, second and third word line, the nitride blocks of the first and second word lines having a respective inner drain sidewall edge which aligns with the respective word line drain sidewall edge, the nitride blocks of the first and second word lines having a respective outer source sidewall edge positioned intermediate the respective word line drain sidewall edge and the respective word line source sidewall edge, the nitride blocks thereby defining a widened mask misalignment area than were such blocks not present;

forming a nitride spacer layer over the blocks;

anisotropically etching the nitride spacer layer to form insulating sidewall spacers over the first and second word line drain sidewall edges, the anisotropic etching leaving nitride material from the nitride blocks covering at least a portion of each of the first and second word lines, the inner drain sidewall edges of the nitride blocks joining with the sidewall spacers to cover the first and second word line drain sidewall edges;

forming an oxide layer over the sidewall spacers and blocks; and patterning and etching the oxide layer selectively relative to the nitride blocks and sidewall spacers to define a contact opening to the drain area, the contact opening overlapping with at least one of the nitride blocks; and forming an electrically conductive plug within the contact opening.

13. A method of forming a non-volatile memory array comprising the following steps:

providing first and second word lines having floating gates atop a semiconductor substrate, the first and second word lines being adjacent one another and defining transistor active area therebetween, the first and second word lines having inwardly opposing and facing active area sidewall edges, the first and second word lines each having respective lateral widths and comprising respective nitride capping layers having a thickness of at least about 1000 Angstroms and a lateral width which is less than the lateral width of its respective word line;

providing a nitride spacer layer over the nitride capping layer;

anisotropically etching the nitride spacer layer to produce insulating sidewall spacers over the first and second word line active area sidewall edges, the anisotropic etching leaving at least a portion of the nitride capping layer covering each of the first and second word lines, the portion of each nitride capping layer joining with one of the sidewall spacers to cover the first and second word line active area sidewall edges and thereby defining a widened mask misalignment area than were such capping layer portions not present;

providing an oxide layer over the sidewall spacers and capping layer;

patterning and etching the oxide layer selectively relative to the nitride capping layer and sidewall spacers to define a contact opening to the active area; and providing an electrically conductive plug within the contact opening.

14. A method of forming a non-volatile memory array comprising the following steps:

providing first, second and third word lines having floating gates atop a semiconductor substrate, the first and second word lines being adjacent one another and defining transistor drain area therebetween, the second and third word lines being adjacent one another and defining transistor source area therebetween, the first and second word lines having inwardly opposing and facing drain sidewall edges, the second and third word lines having inwardly opposing and facing source sidewall edges, the word lines comprising respective nitride capping layers having a thickness of at least about 1000 Angstroms;

masking a portion of the nitride capping layers over each of the first, second and third word lines, the mask covering over the first and second word line drain sidewall edges, the mask exposing the first and second word line source sidewall edges;

etching exposed portions of the masked nitride capping layers to define nitride blocks which partially cover each first, second and third word line, the nitride blocks of the first and second word lines having a respective inner drain sidewall edge which aligns with the respective word line drain sidewall edge, the nitride blocks of the first and second word lines having a respective outer source sidewall edge positioned intermediate the respective word line drain sidewall edge and the respective word line source sidewall edge, the nitride blocks thereby defining a widened mask misalignment area than were such blocks not present;

providing a nitride spacer layer over the blocks;

anisotropically etching the nitride spacer layer to produce insulating sidewall spacers over the first and second word line drain sidewall edges, the anisotropic etching leaving nitride material from the nitride blocks covering at least a portion of each of the first and second word lines, the inner drain sidewall edges of the nitride blocks joining with the sidewall spacers to cover the first and second word line drain sidewall edges;

providing an oxide layer over the sidewall spacers and blocks; and patterning and etching the oxide layer selectively relative to the nitride blocks and sidewall spacers to define a contact opening to the drain area; and providing an electrically conductive plug within the contact opening.

* * * * *

UNITED STATES PATENT AND TRADEMARK OFFICE
CERTIFICATE OF CORRECTION

PATENT NO.   : 5,736,444
DATED        : April 7, 1998
INVENTOR(S)  : Kauffman, et. al.

It is certified that error appears in the above-indentified patent and that said Letters Patent is hereby corrected as shown below:

Column 1, line 16, after "arrays", insert --having--

Column 4, line 59, after "nitride", delete "cupping" and replace with --capping--

Signed and Sealed this

Twenty-fifth Day of August, 1998

Attest:

BRUCE LEHMAN

*Attesting Officer*   *Commissioner of Patents and Trademarks*